United States Patent
Hui et al.

(10) Patent No.: US 8,948,138 B2
(45) Date of Patent: Feb. 3, 2015

(54) SIGNAL COMPRESSION FOR BACKHAUL COMMUNICATIONS USING LINEAR TRANSFORMATIONS

(75) Inventors: Dennis Hui, Sunnyvale, CA (US);
Jung-Fu Cheng, Fremont, CA (US);
Jiann-Ching Guey, Fremont, CA (US);
Ali S. Khayrallah, Mountain View, CA (US); Shing-Wa Wong, Saratoga, CA (US)

(73) Assignee: Telefonaktiebolaget L M Ericsson (Publ), Stockholm (SE)

( * ) Notice: Subject to any disclaimer, the term of this patent is extended or adjusted under 35 U.S.C. 154(b) by 987 days.

(21) Appl. No.: 13/070,414

(22) Filed: Mar. 23, 2011

(65) Prior Publication Data

US 2012/0243468 A1    Sep. 27, 2012

(51) Int. Cl.
| H04W 4/00 | (2009.01) |
| H04B 7/02 | (2006.01) |
| H03M 7/30 | (2006.01) |

(52) U.S. Cl.
CPC ............. *H04B 7/024* (2013.01); *H03M 7/3068* (2013.01); *H03M 7/3082* (2013.01)
USPC .......................................................... 370/334

(58) Field of Classification Search
None
See application file for complete search history.

(56) References Cited

U.S. PATENT DOCUMENTS

| 4,694,482 | A  | * | 9/1987  | Reesor et al. ............... | 379/27.01 |
| 8,169,978 | B2 | * | 5/2012  | Sheng et al. .................. | 370/335   |
| 2004/0186867 | A1 | * | 9/2004  | Schenk ......................... | 708/300   |
| 2006/0117078 | A1 | * | 6/2006  | Hou et al. ..................... | 708/400   |
| 2007/0153731 | A1 | * | 7/2007  | Fine ............................... | 370/329   |
| 2008/0025416 | A1 | * | 1/2008  | Jafarkhani et al. ............ | 375/245   |
| 2008/0095262 | A1 | * | 4/2008  | Ho et al. ........................ | 375/295   |
| 2008/0120095 | A1 | * | 5/2008  | Oh et al. ........................ | 704/203   |
| 2009/0082064 | A1 | * | 3/2009  | Li et al. ...................... | 455/562.1 |
| 2009/0185607 | A1 | * | 7/2009  | Lee et al. ...................... | 375/224   |
| 2009/0245399 | A1 | * | 10/2009 | Lee et al. ...................... | 375/260   |
| 2009/0297054 | A1 | * | 12/2009 | Regunathan et al. ......... | 382/248   |
| 2010/0062775 | A1 | * | 3/2010  | Hwang .......................... | 455/442   |
| 2010/0103834 | A1 | * | 4/2010  | Gorokhov et al. ............ | 370/252   |
| 2010/0198990 | A1 | * | 8/2010  | Shimada et al. .............. | 709/246   |
| 2010/0208834 | A1 | * | 8/2010  | van Zelst et al. ............. | 375/267   |
| 2011/0122957 | A1 | * | 5/2011  | Tamaki et al. ................ | 375/260   |
| 2012/0057535 | A1 | * | 3/2012  | Zhang et al. .................. | 370/329   |

FOREIGN PATENT DOCUMENTS

WO         WO 98/54850 A2    12/1998

* cited by examiner

*Primary Examiner* — Kwang B Yao
*Assistant Examiner* — Hardikkumar Patel

(57) ABSTRACT

A compression/decompression method for backhaul communication of a complex-valued radio signal between base stations and the network processing unit, such as a Central Processor of a Coordinated MultiPoint (CoMP) system, significantly reduces backhaul bandwidth. The spatial and temporal correlations of the wireless IQ signal are exploited in order to remove redundancy and substantially reduce signal bandwidth. Feature component signals of significance are extracted through linear transformation to form the radio signal, and are individually quantized, possibly at different bit rates in accordance with their relative importance. The transformation can either be pre-determined or computed in real-time based on the spatial and temporal statistics of the radio signal. In the latter case, the transformation matrix or matrices are also sent over the backhaul in order to allow the radio signal to be reconstructed at the receiving end. Different methods of generating the transformation matrices are proposed.

38 Claims, 5 Drawing Sheets

SIGNAL COMPRESSION FOR BACKHAUL COMMUNICATIONS USING LINEAR TRANSFORMATIONS

FIELD OF INVENTION

The present invention relates generally to wireless telecommunications, and in particular to a method of compressing signals for transmission on backhaul channels in wireless telecommunication networks.

BACKGROUND

The exponential growth in the demand of wireless data communications has put a tremendous pressure on the cellular network operators to improve the capacity of their communication networks. To improve the spectral efficiency of these networks, scarce radio resources have to be reused aggressively in neighboring cells. As a result, inter-cell interference has become a main source of signal disturbance, limiting not only the service quality of the cell-edge users, but also the overall system throughput.

Coordinated multi-point (CoMP) transmission or reception is one known means to effectively mitigate inter-cell interference. FIG. 1 depicts a representative CoMP cluster 10, in which User Equipment (UE) 12 receive wireless communication service in a number of conventional cells 14. A base station or eNode B 16 transmits downlink RF signals to UE 12 (and receives uplink transmissions from the UE 12) in each cell 14. To avoid inter-cell interference, a central processor (CP) 30 coordinates downlink transmissions to, and possibly also uplink transmissions from, UE 12 in the cells 14 forming the CoMP cluster 10. The CP 30 coordinates and optimizes transmissions to reduce or even avoid mutual interference among UE 12. The benefit attainable by the deployment of CoMP systems hinges on how well such coordination can be performed by the CP 30.

To enable the CP 30 to effectively coordinate transmission and/or reception at multiple cells 14, timely signal information must be communicated between remote base station sites 16 and the CP 30. However, the amount of information needed to send to or receive from each base station 16 can be overwhelming, especially when multiple antennas are deployed at each site. In general, the CP 30 generates, and must transmit to remote base stations 16, the In-phase (I) and Quadrature (Q) components of complex-valued downlink signals to be transmitted by each antenna at each base station 16. Additionally, each base station 16 must transmit to the CP 30 the complex-valued IQ signal received at each antenna.

In the standard Common Public Radio Interface (CPRI), each real-valued sample of the IQ backhaul signal would simply be quantized independently by a fixed number of bits (e.g., 16). CPRI transmission does not exploit any structure of the underlying backhaul signal, and is an inefficient way of representing wireless communication signals. CPRI transmission of IQ wireless signals thus places a large burden on the capacity of backhaul links, which may limit the performance otherwise achievable by CoMP systems.

Other systems may additionally perform precoding at a processing unit of a network, for transmission by base stations. All such systems require voluminous data transfer between the network processing unit and base stations.

SUMMARY

According to one or more embodiments described and claimed herein, a compression/decompression method reduces backhaul bandwith required for communicating a complex-valued radio signal between base stations and a processing unit, such as for example the Central Processor of a Coordinated MultiPoint (CoMP) system. The method exploits both the spatial and temporal correlation of the wireless IQ signal in order to remove redundancy and substantially reduce the capacity requirement of the backhaul links. Feature component signals of significance are extracted through linear transformation from the radio signal, and are individually quantized, possibly at different bit rates in accordance with their relative importance. The transformation can either be pre-determined or computed in real-time based on the spatial and temporal statistics of the radio signal. In the latter case, the transformation matrix or matrices are also sent over the backhaul in order to allow the radio signal to be reconstructed at the receiving end. Different methods of generating the transformation matrices are proposed.

One embodiment relates to a method of transmitting wireless communication signals across a backhaul channel between a base station and a network processing unit. A wireless communication signal is represented as a plurality of time-domain, complex-valued signal samples. At least one linear transformation of the signal samples is performed across one or more of time and antenna spatial domains to generate transformed signal coefficients. The transformed signal coefficients are quantized. The quantized transformed signal coefficients are transmitted across the backhaul. Quantization information is also transmitted across the backhaul.

Another embodiment relates to a method of receiving wireless communication signals across a backhaul channel between a base station and a network processing unit. Quantized transformed signal coefficients are received across the backhaul. Quantization information is received across the backhaul. Transformed signal coefficients are decoded from the quantized transformed signal coefficients based on the quantization information. At least one inverse linear transformation of the transformed signal coefficients is performed across one or more of time and antenna spatial domains to recover a plurality of time-domain, complex-valued signal samples corresponding to a wireless communication signal.

Yet another embodiment relates to a base station. The base station includes one or more antennas, and at least one front end circuit operative to front end process a wireless communication signal received from the antenna, and generate a plurality of time-domain, complex-valued signal samples. The base station further includes at least one transformation unit operative to perform a linear transformation of the signal samples across one or more of time and antenna spatial domains to generate transformed signal coefficients. The base station also includes a transmit bit allocation unit operative to determine a number of quantization bits for quantization of the transformed signal coefficients based on the variance of the coefficients. The base station further includes a quantizer operative to quantize the transformed signal coefficients using the number of bits determined by the bit allocation unit. The base station additionally includes a backhaul communication interface operative to transmit quantized transformed signal coefficients and quantization information across the backhaul to a network processing unit.

Still another embodiment relates to a network processing unit. The processing unit includes a backhaul communication interface operative to receive quantized transformed signal coefficients and quantization information from a plurality of base stations. The processing unit also includes a receive bit allocation unit operative to determine a number of quantization bits for decoding quantized transformed signal coefficients received from a base station, based on the received quantization information. The processing unit further includes a decoder operative to decode the received quantized transformed signal coefficients based on a number of bits determined by the bit allocation unit. The processing unit additionally includes at least one inverse transformation unit operative to perform an inverse linear transformation of the transformed signal coefficients across one or more of time and antenna spatial domains to generate a plurality of time-domain, complex-valued signal samples. The processing unit also includes a processing circuit operative to process the signal samples.

DETAILED DESCRIPTION

Figure 1:
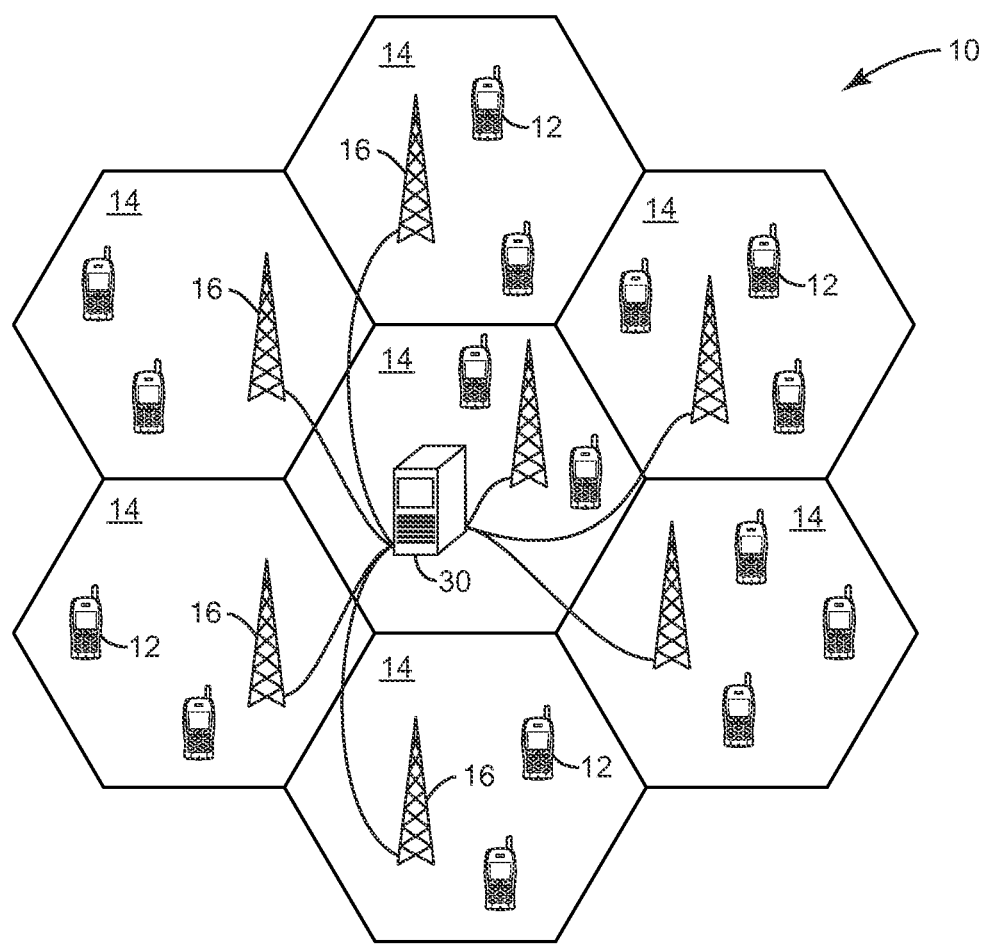
FIG. 1 is a functional block diagram of a Coordinated MultiPoint system 10.

According to embodiments of the present invention, backhaul communications between a network processing unit 30 and base stations 16 in a wireless communication system 10 are significantly reduced. To provide context, and solely for the purpose of explanation herein, embodiments of the invention are described wherein the network processing unit 30 is a Central Processor (CP) 30 of a Coordinated MultiPoint (CoMP) system 10. However, the invention is not limited to CoMP systems 10, but may find applicability in any wireless communication system 10 in which a network processing unit 30 performs signal processing, such as precoding, on signals to be transmitted by base stations 16, and which must be communicated to the base stations 16 over a backhaul communication link. Accordingly, all references herein to a CP 30 or a CoMP system 10 are to be understood as a non-limiting example of a network processing unit 30 in a wireless communication network 10.

The backhaul communications are reduced by performing targeted compression on complex-valued IQ radio signals prior to backhaul transmission, and corresponding decompression on the signals following backhaul reception. The signal compression may be applied to both downlink signals to be transmitted by base station 16 antennas, and uplink signals received by base station 16 antennas. The compression methodology extracts feature component signals of significance through linear transformations in time and/or antenna spatial domains, and individually quantizes them. The transformation can either be pre-determined or computed in real-time based on the spatial and temporal statistics of the radio signal.

Figure 2:
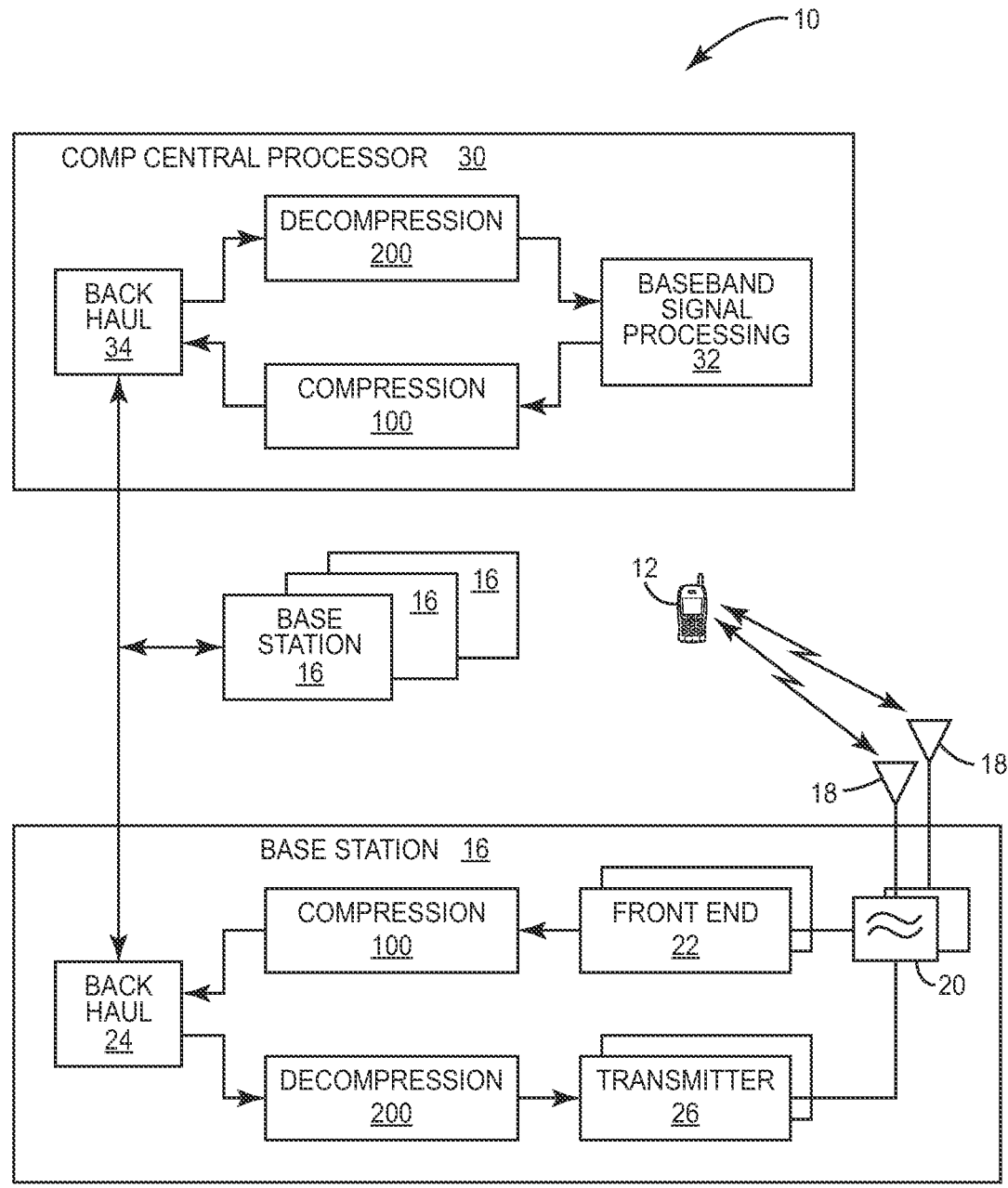
FIG. 2 depicts functional block diagrams of a Central Processor 30 and a base station 16.

FIG. 2 depicts a CP 30 and representative base station 16, according to embodiments of the present invention. The CP 30 includes a CoMP processing unit 32, signal compression unit 100, signals decompression unit 200, and a backhaul channel interface 34. As known in the art, the CoMP processing unit 32 coordinates transmission to all UE 12 in the cells 14 comprising the CoMP cluster 10, so as to reduce or eliminate mutual interference among the UE 12. The backhaul interface 34 is operative to receive and transmit data from and to numerous base stations 16 across a high-speed, high-bandwidth communication channel. In some embodiments, the backhaul communication channel may comprise an optical channel. Even though the backhaul communication channel offers high bandwidth, the volume of data transfer between the CP 30 and base stations 16 necessary for effective CoMP system operation may easily overwhelm the capacity of the backhaul communication channel. Accordingly, according to embodiments of the present invention, RF IQ signal data transfer between the CP 30 and base stations 16 is compressed prior to transmission, by the compression unit 200, and decompressed upon reception, by the decompression unit 200.

The base station 16, also depicted in FIG. 2, includes one or more antennas 18 and a corresponding number of duplexers 20, front end receivers 22, and transmitters 26. The base station 16 also includes a compression unit 100, decompression unit 200, and a backhaul channel interface 24. As known in the art, the base station 16 receives uplink wireless communication signals from UE 12 in the cell 14. These signals are routed by duplexers 20 to a front end receiver 22, which may include signal processing functions such as low noise amplification, filtering, analog to digital conversion, frequency downconversion, IQ separation, and the like. The processed received signals are compressed in the compression unit 100 and transmitted to the CP 30 across the backhaul communication channel via the backhaul interface 24. Signals to be transmitted to the UE 12 are received by the base station 16 from the CP 30, in compressed format, by the backhaul interface 24. These signals are decompressed by the decompression unit 200, and may be modulated, filtered, amplified, and the like by transmitter circuit 26. The resulting RF signal is then routed by the duplexer 20 to an antenna 18 for transmission to UE 12 in the cell 14. In general, separate signals may be received from the CP 30 for transmission on each antenna 18.

In a typical wireless communication system, signals are transmitted in a multitude of time slots. Let T denote the duration of one such time slot. Within each time slot, the statistical behavior of the received or transmit signal remains roughly stationary, which is especially true when the base stations 16 in the network are synchronized. Let $T_s$ denote the sampling time period of the radio signal, and let $N=T/T_s$ be the number of time samples within a time slot. Let $y[n,m]=[y_1[n,m], y_2[n,m], \ldots, y_{n_a}[n,m]]^T$ denote an $n_a$-dimensional time-domain complex-valued sampled signal to be communicated through a backhaul link connecting a Central Processor 30 from or to a particular base station 16, where $n_a$ denote the number of antennas at the base station 16 and $n \in \{1,2,\ldots,N\}$ denotes the sample time index within one time slot, $m \in \{1,2,\ldots,M\}$ denotes the time-slot index, and M denotes the maximum number of time slots over which the statistics of the signal remain roughly stationary. For example, in the Long Term Evolution (LTE) of UMTS/HSDPA, M is greater than or equal to 2, depending on the scheduling decision and user activity.

Figure 3:
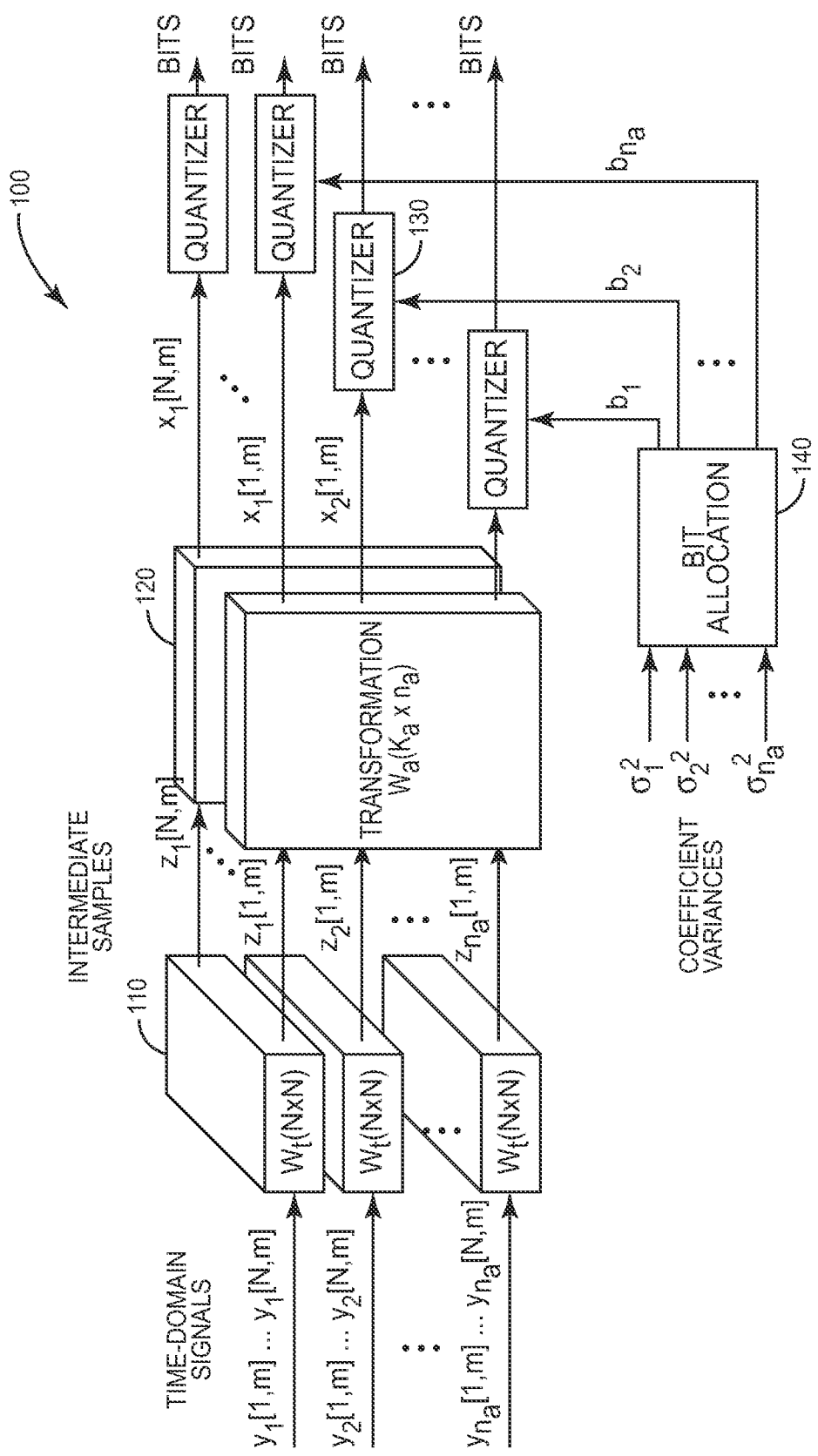
FIG. 3 is a functional block diagram of a compression unit 100.
Figure 4:
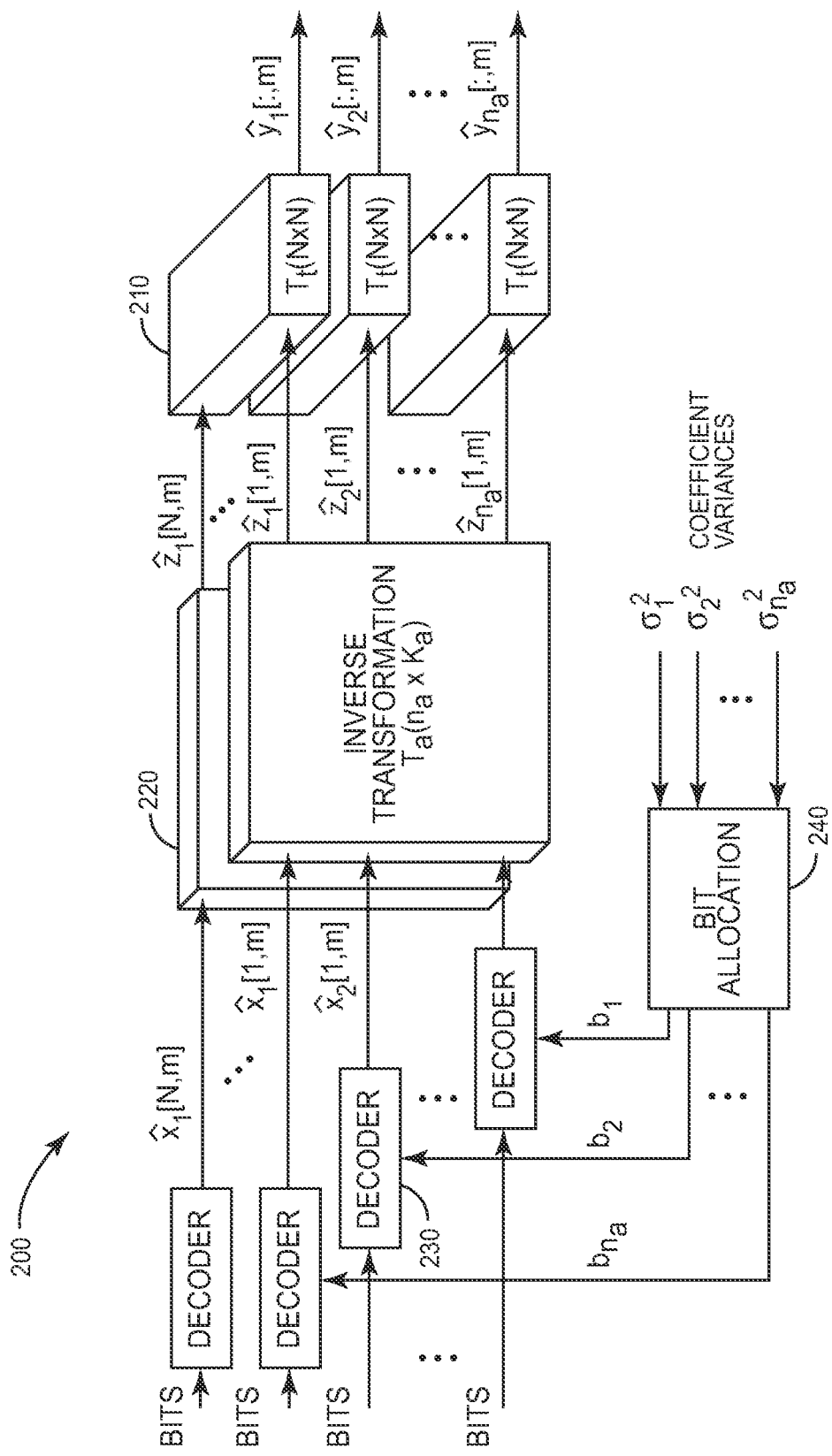
FIG. 4 is a functional block diagram of a decompression unit 200.

According to embodiments of the present invention, the backhaul signal is compressed by exploiting its spatial and temporal correlation through linear transformations. In one embodiment, two stages of linear transformations are applied to the sampled signal y[n,m]. The structure of the encoding unit 100 and decoding unit 200 are depicted in FIGS. 3 and 4, respectively. The first linear transformation $W_t$ 110 applies to the time-domain sampled signals. The second linear transformation $W_a$ 120 applies to the intermediate samples across the antennas. Then, the feature samples are quantized 130, according to information from a bit allocation unit 140, before being transported over the backhaul. Depending on a-priori knowledge of the underlying signal, the order of the linear transformation 110, 120 is interchangeable. For example, the compression unit 100 can instead first exploit known structure in the spatial domain before processing the time-domain signals.

The linear transformation $W_t$ 110, which is applied to the time-domain sampled signals, is described first. Let $Y_i[m] \equiv [y_i[1,m], y_i[2,m], L, y_i[N,m]]^T$ denote a vector formed by stacking the time samples received from, or to be transmitted by, antenna i in time slot m. For example, the time-domain analysis and synthesis transformation, $W_t$ 110 and $T_t$ 210 (see FIG. 4) respectively, may be selected as the Discrete Cosine Transform (DCT) and the inverse DCT matrices—both of which are a form of Fast Fourier Transform (FFT). Alternatively, the transformation matrices may be adaptively computed through the eigen-decomposition of the N×N covariance matrix $R_Y = E[Y_i[m]Y_i[m]^H]$ which can be approximately computed by $$R_Y \approx \frac{1}{n_a M} \sum_{m=1}^{M} \sum_{i=1}^{n_a} Y_i[m] Y_i[m]^H.$$

Let the eigen decomposition of $R_Y$ be $U_t \Lambda_Y U_t^H$, where $\Lambda_Y$ is a diagonal matrix with the eigenvalues $\{\lambda_{t,j}\}_{j=1}^{N}$ of $R_Y$ as its diagonal elements, and $U_t$ is an orthonormal matrix with the eigenvectors of $R_Y$ as its columns. In this case, the analysis and synthesis transformation matrices 110, 210 should be set as $W_t = U_t^H$ and $T_t = U_t$, respectively.

The intermediate samples, $\{z_i[n,m]\}$, generated after the time-domain transformation 110 are related to $Y_i[m]$ for each antenna i through $$\begin{bmatrix} z_i[1,m] \\ z_i[2,m] \\ M \\ z_i[N,m] \end{bmatrix} = W_t Y_i[m].$$

The intermediate samples can be compressed using a-priori information, such as nulls in the intermediate transform domain created by scheduling. In this case, the compression unit 100 can determine which transformed intermediate transform domain components should be quantized and which components should be excluded. A similar method can be applied to exploit time-domain scheduling information in, for example, a time-division multiplexed system, in which case, $W_t$ 110 may simply be chosen as the N by N identity matrix.

After the time-domain transformation 110, the intermediate samples are grouped across the spatial dimension, i.e. $z[n,m] = [z_1[n,m], z_2[n,m], L, z_{n_a}[n,m]]^T$, to prepare for transformation in the spatial domain.

The transformations in spatial domain 120 (i.e., exploiting correlation across antennas), are now described. Let $W_a$ 120 and $T_a$ 220 denote an analysis transformation matrix 120 of dimension $K_a \times n_a$ and a synthesis transformation matrix 220 of dimension $n_a \times K_a$ respectively. Since we are interested in compressing the signal, the transformation matrices are designed such that $K_a \leq n_a$. For each time sample n in time slot m, a feature vector $x[n,m]$ of dimension $K_a$ is computed using $W_a$ 120 given by $$x[n,m] = [x_1[n,m], x_2[n,m], L, x_{K_a}[n,m]]^T = W_a z[n,m]$$

and then quantize 130 each component feature $x_i[n,m]$ individually using a codebook $C_i$ of size $|C_i| = 2^{b_i}$, where $b_i$ denotes the number of bits 140 needed to index each code vector in $C_i$. Different codebook sizes can be assigned to different feature components depending on their relative significance (e.g., measured by their statistical variances). Associated with each $b_i$-bit index for the codebook $C_i$ is a reproduction codeword $\hat{x}_i[n,m] \in C_i$ of the feature component. The goal of the compression unit 100 is to select $$\hat{x}[n,m] \equiv [\hat{x}_1[n,m], \hat{x}_2[n,m], L, \hat{x}_{K_a}[n,m]]^T \in C_1 \times C_2 \times L \times C_{K_a} @ \prod_{i=1}^{K_a} C_i$$

such that $T_a \hat{x}[n,m]$ closely approximates $z[n,m]$. For example, the compression unit 100 should compute $$\hat{x}[n,m] = \underset{x \, \% \in \prod_{i=1}^{K_a} C_i}{\arg\min} \|z[n,m] - T_a x \, \%\|^2. \quad (1)$$

From the orthogonality principle, we have $$\hat{x}[n,m] = \underset{x \, \% \in \prod_{i=1}^{K_a} C_i}{\arg\min} \left[ \begin{array}{l} \|z[n,m] - T_a(T_a^H T_a)^{-1} T_a z[n,m]\|^2 + \\ \|T_a((T_a^H T_a)^{-1} T_a z[n,m] - x \, \%)\|^2 \end{array} \right] \quad (2)$$

$$= \underset{x \, \% \in \prod_{i=1}^{K_a} C_i}{\arg\min} \|T_a((T_a^H T_a)^{-1} T_a^H z[n,m] - x \, \%)\|^2.$$

Hence, for any given synthesis transform $T_a$ 220, the best analysis transform 120 is given by its pseudo inverse $$W_a = (T_a^H T_a)^{-1} T_a^H, \quad (3)$$

which projects $z[n,m]$ onto the column space of $T_a$. Substituting equation (3) into (2), we have $$\hat{x}_i[n,m] = \underset{x \, \% \in \prod_{i=1}^{K_a} C_i}{\arg\min} \|T_a(W_a z[n,m] - x \, \%)\|^2 \quad (4)$$

$$= \underset{x \, \% \in \prod_{i=1}^{K_a} C_i}{\arg\min} \|T_a(x[n,m] - x \, \%)\|^2.$$

In general, the quantization of all feature components should be performed jointly over the product codebook $$\prod_{i=1}^{K_a} C_i$$

with the joint distortion metric $$d(x,y) = (x-y)^H T_a^H T_a (x-y)$$

to achieve the best performance.

In the special case where the columns of $T_a$ 220 are chosen to be orthogonal, we have $$\hat{x}_i[n,m] = \sum_{i=1}^{K_a} w_i \underset{x_i \, \% \in C_i}{\arg\min} |x_i[n,m] - x \, \%|^2.$$

where $w_i$ denotes the squared norm of the i-th column of $T_a$ 220. Hence, the compression unit 100 can quantize 130 each feature component $x_i[n,m]$ using $C_i$ individually with the per-feature distortion metric $$d(x,y) = |x-y|^2$$

without affecting the overall performance. This presents significant complexity reduction since joint optimization across all feature dimensions simultaneously is not required, as in the original formulation in equation (1).

In one embodiment of the spatial transform, $T_a$ 120 is a square orthonormal matrix with $K_a=n_a$. In this case, also $W_a=T_a^H$. $T_a$ 120 can be chosen to be a standard predetermined orthonormal matrix, such as the FFT or the DCT matrices. Alternatively, an orthonormal matrix can be adaptively computed that maximizes the energy compaction in fewer feature components. When the signal samples z[n,m] are Gaussian distributed, the best transform is the Karhunen-Loeve Transform (KLT) U whose columns are the eigenvectors of the signal covariance matrix $R_z=E[z[n,m]z[n,m]^H]$, which can be computed approximately by averaging over different time samples and time slots as $$R_z \cong \frac{1}{MN}\sum_{m=1}^{M}\sum_{n=1}^{N}z[n,m]z[n,m]^H.$$

Moreover, the eigenvalues $\{\lambda_i\}$ of $R_z$ also provides the relative significance of the corresponding feature component $\{x_i[n,m]\}$, which can be used to determine the number of bits $\{b_i\}$ 140 used to quantize $\{x_i[n,m]\}$ 130. Specifically, $\lambda_i=\sigma_i^2$, where $\sigma_i^2$ denotes the variance of the i-th transformed coefficient. There are a number of possible methods to determine $\{b_i\}$ 140 depending on the type of quantizer 130 used. For fixed-rate quantization, $\{b_i\}$ 140 can be computed using a high-resolution approximation as $$b_i \cong \frac{b_{total}}{n_a} + \frac{1}{2}\log\left(\sigma_i^2 \Big/ \left(\prod_{j=1}^{n_a}\sigma_j^2\right)^{1/n_a}\right)$$

where $b_{total}$ denotes the total number of bits available to index all components $\{\hat{x}_i[n,m]\}$. The approximation can be further simplified by allocating equal number of bits to the first k components, where $\sigma_k^2 > \beta$ and $k < n_a$. In this case, $\beta$ is the minimum energy that determines if a feature component should be neglected. Alternatively, one can select the Breiman, Friedman, Olshen, and Stone (BFOS) algorithm to optimally allocate the bits for a given set of component codebooks $\{C_i\}$, as described in the paper by E. A. Riskin, "Optimal bit allocation via the generalized BFOS algorithm," published in the *IEEE Trans, Info Thy.*, vol 37, pp. 400-402, March 1991, the disclosure of which is incorporated herein by reference in its entirety. The quantizer 130 for each coefficient can also be a variable-rate quantizer 130. In this case, it is preferred to use a quantizer 130 with a fixed step or cell size. The fidelity of the reproduced signal is determined by the choice of the step or cell size.

In one embodiment, the spatial transformation matrices 120, 220 described above are computed in real time based on the spatial and temporal statistics of the radio signal, which are also measured from the radio signal. The coefficients of the spatial transformation matrices 120, 220 are transmitted over the backhaul, to allow the radio signal to be reconstructed at the receiving end. The frequency at which such statistics and coefficients are computed depends on the stationarity of the underlying signal, which depends on the scheduling decisions and user activity. For example, in the LTE network, this period lasts at least 2 time slots. The representation of the spatial transform coefficients and the bit allocation information can be done using fixed-rate (for example, 8 bit per coefficient) quantization 130.

Figure 5:
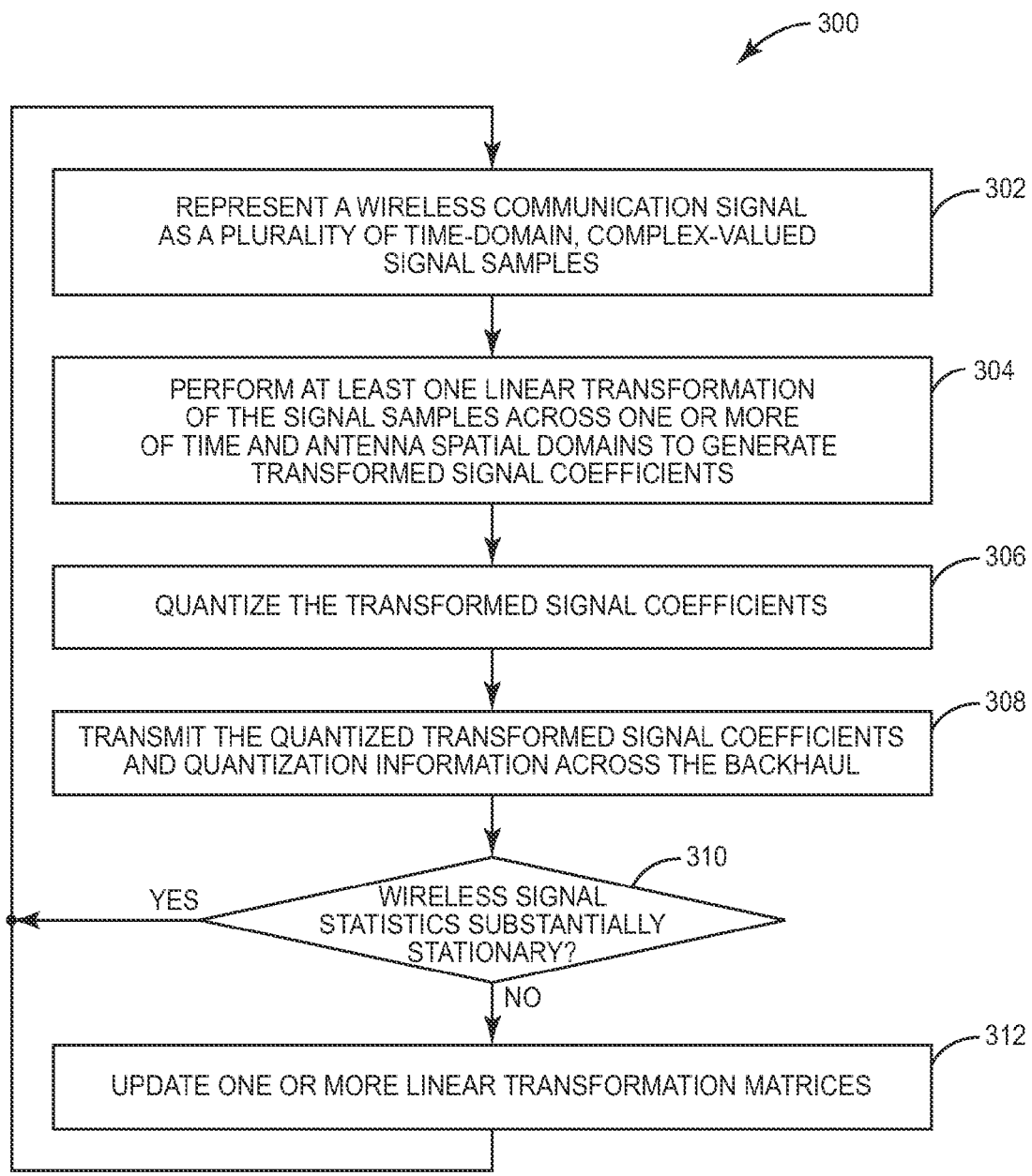
FIG. 5 is a flow diagram of a method of transmitting wireless communication signals across a backhaul channel between a base station 16 and a Central Processor 30.

FIG. 5 depicts a method 300 of transmitting wireless communication signals across a backhaul channel between a base station 16 and a Central Processor 30 in a CoMP system 10. A wireless communication signal is represented as a plurality of time-domain, complex-valued signal samples (block 302), e.g., I and Q components. At least one linear transformation 110, 120 of the signal samples is performed across one or more of time and antenna spatial domains to generate transformed signal coefficients (block 304). As described above, a-priori knowledge of the signal characteristics may determine the order of the linear transformations 110, 120. The transformed signal coefficients are quantized (block 306), in one embodiment using a variable number of quantization bits determined by a bit allocation unit 140 based on the variances of the transformed coefficients. The quantized transformed signal coefficients and quantization information (i.e., the number of quantization bits or the coefficient variances) are transmitted across the backhaul (block 308), i.e., from the base station 16 to the CP 30 for uplink signals, or from the CP 30 to one or more base stations 16 for downlink signals. The method steps are repeated while the wireless signal statistics remain substantially stationary (block 310). When the signal statistics have changed appreciably (block 310), one or more linear transformation matrices 110, 120 are updated (block 312), and the method 300 repeats. A similar, inverse method is performed at the receiving one of the base station 16 or CP 30.

Embodiments of the present invention provide an effective method to compress the digitized representations of complex-valued radio signals either received from or to be transmitted by each antenna at a remote base station 16 in a CoMP cluster 10. The compression exploits spatial and temporal correlations in the radio signals, and extracts feature components from these signals. In some embodiments the method utilizes a-priori knowledge, such as known scheduling information, to neglect part of the signal component and reduce both computational and backhaul bandwidth burden.

Embodiments of the present invention can optimally compress the feature components of wireless communication signals according to known total backhaul bandwidth constraints. The bandwidth is then allocated to each feature component according to its significance. Moreover, in some embodiments, because feature components are sorted according to their significance, the backhaul network may adaptively reject lower impact feature components, to further preserve bandwidth in the backhaul links.

The present invention may, of course, be carried out in other ways than those specifically set forth herein without departing from essential characteristics of the invention. The present embodiments are to be considered in all respects as illustrative and not restrictive, and all changes coming within the meaning and equivalency range of the appended claims are intended to be embraced therein.

What is claimed is:

1. A method of transmitting wireless communication signals across a backhaul channel between a base station and a network processing unit, comprising:
representing a wireless communication signal as a plurality of time-domain, complex-valued signal samples;
performing at least one linear transformation of the plurality of time-domain, complex-valued signal samples across one or more of time and antenna spatial domains to generate transformed signal coefficients;
quantizing the transformed signal coefficients; and
transmitting the quantized transformed signal coefficients across the backhaul; and
transmitting quantization information across the backhaul.

2. The method of claim 1 wherein the network processing unit is a Central Processor of a Coordinated MultiPoint (CoMP) system.

3. The method of claim 1 wherein representing a wireless communication signal as a plurality of time-domain, complex-valued signal samples comprises:
receiving at least one wireless communication signal at an antenna; and
front end processing the received at least one wireless communication signal to generate a plurality of time-domain, complex-valued signal samples.

4. The method of claim 1 further comprising, following performing the at least one linear transformation:
selecting the transformed signal coefficients having signal energy above a threshold; and
wherein quantizing the transformed signal coefficients comprises quantizing only the selected transformed signal coefficients.

5. The method of claim 1 wherein one of the at least one linear transformation is constant over a duration over which spatial and temporal statistics of the wireless communication signal remain substantially stationary.

6. The method of claim 5 wherein the duration comprises at least two Long Term Evolution time slots.

7. The method of claim 1 wherein the linear transformation across the time domain is a Discrete Cosine Transform.

8. The method of claim 1 wherein the linear transformation across the time domain is adaptively computed based on a covariance of the wireless communication signal.

9. The method of claim 1 wherein the linear transformation across the antenna spatial domain is computed using a predetermined orthonormal transformation matrix.

10. The method of claim 9 wherein the predetermined orthonormal transformation matrix comprises one of a Fast Fourier Transform or Discrete Cosine Transform matrix.

11. The method of claim 1 wherein the linear transformation across the antenna spatial domain is adaptively computed to maximize energy compaction into as few feature components as possible.

12. The method of claim 11 wherein the plurality of time-domain, complex-valued signal samples are Gaussian distributed, and wherein the linear transformation across the antenna spatial domain is a Karhunen-Loeve Transform based on a covariance of the wireless communication signal.

13. The method of claim 1 wherein the linear transformation across the antenna spatial domain is computed in real time based on the spatial and temporal statistics of the wireless communication signal, and further comprising transmitting a spatial transformation matrix across the backhaul.

14. The method of claim 1 wherein quantizing the transformed signal coefficients comprises quantizing the transformed signal coefficients using a variable number of bits, based on the variance of the coefficients, and wherein the quantization information transmitted across the backhaul comprises the variance of the coefficients.

15. The method of claim 1 wherein an order of linear transformations performed on the signal samples is determined based on a priori knowledge of the wireless communication signal.

16. The method of claim 1 wherein the wireless communication signal is received at one or more antennas at the base station, wherein the method is performed by the base station for the wireless communication signal received at each antenna, and wherein the quantized transformed signal coefficients and quantization information are transmitted across the backhaul to a Central Processor.

17. The method of claim 1 wherein the wireless communication signal comprises a Central Processor of a Coordinated MultiPoint precoded signal generated at the Central Processor and to be transmitted at an antenna by the base station, wherein the method is performed by the Central Processor, and wherein the quantized transformed signal coefficients and quantization information are transmitted across the backhaul to the base station.

18. A method of receiving wireless communication signals across a backhaul channel between a base station and a network processing unit, comprising:
receiving quantized transformed signal coefficients across the backhaul;
receiving quantization information across the backhaul;
decoding transformed signal coefficients from the quantized transformed signal coefficients based on the quantization information; and
performing at least one inverse linear transformation of the transformed signal coefficients across one or more of time and antenna spatial domains to recover a plurality of time-domain, complex-valued signal samples corresponding to a wireless communication signal.

19. The method of claim 18 wherein the network processing unit is a Central Processor in a Coordinated MultiPoint (CoMP) system.

20. The method of claim 19 wherein the wireless communication signal comprises a CoMP precoded signal generated at the Central Processor and to be transmitted at an antenna by the base station, wherein the method is performed by the base station, and wherein the quantized transformed signal coefficients and quantization information are transmitted across the backhaul by the Central Processor.

21. The method of claim 18 further comprising:
processing the plurality of time-domain, complex-valued signal samples to generate a wireless communication signal; and
transmitting the wireless communication signal from an antenna.

22. The method of claim 18 wherein one of the at least one inverse linear transformation is constant over a duration over which spatial and temporal statistics of the wireless communication signal remain substantially stationary.

23. The method of claim 22 wherein the duration comprises at least two Long Term Evolution time slots.

24. The method of claim 18 wherein the inverse linear transformation across the time domain is an inverse Discrete Cosine Transform.

25. The method of claim 18 wherein the inverse linear transformation across the time domain is adaptively computed based on a covariance of the wireless communication signal.

26. The method of claim 18 wherein the inverse linear transformation across the antenna spatial domain is computed using a predetermined orthonormal inverse transformation matrix.

27. The method of claim 26 wherein the predetermined orthonormal inverse transformation matrix comprises one of an inverse Fast Fourier Transform or inverse Discrete Cosine Transform matrix.

28. The method of claim 18 wherein the inverse linear transformation across the antenna spatial domain is adaptively computed to maximize energy compaction into as few feature components as possible.

29. The method of claim 28 wherein the plurality of time-domain, complex-valued signal samples are Gaussian distributed, and wherein the inverse linear transformation across the antenna spatial domain is an inverse Karhunen-Loeve Transform based on a covariance of the wireless communication signal.

30. The method of claim 18 wherein the inverse linear transformation across the antenna spatial domain is computed in real time based on the spatial and temporal statistics of the wireless communication signal, and further comprising receiving a spatial transformation matrix across the backhaul.

31. The method of claim 18 wherein decoding transformed signal coefficients comprises decoding the transformed signal coefficients using a variable number of bits, based on the variance of the coefficients, and wherein the quantization information received across the backhaul comprises the variance of the coefficients.

32. The method of claim 18 wherein an order of inverse linear transformations performed on the transformed signal coefficients is determined based on a priori knowledge of the wireless communication signal.

33. The method of claim 18 wherein the wireless communication signal is first received at one or more antennas at the base station, wherein the method is performed by the network processing unit, and wherein the quantized transformed signal coefficients and quantization information are transmitted across the backhaul by the base station.

34. A base station, comprising:
one or more antennas;
at least one front end circuit operative to front end process a wireless communication signal received from the antenna, and generate a plurality of time-domain, complex-valued signal samples;
at least one transformation unit operative to perform a linear transformation of the plurality of time-domain, complex-valued signal samples across one or more of time and antenna spatial domains to generate transformed signal coefficients;
a transmit bit allocation unit operative to determine a number of quantization bits for quantization of the transformed signal coefficients based on the variance of the coefficients;
a quantizer operative to quantize the transformed signal coefficients using the number of quantization bits determined by the transmit bit allocation unit; and
a backhaul communication interface operative to transmit quantized transformed signal coefficients and quantization information across the backhaul to a network processing unit.

35. The base station of claim 34, further comprising:
a receive bit allocation unit operative to determine a number of quantization bits for decoding received quantized transformed signal coefficients based on quantization information received across the backhaul communication interface from the network processing unit;
a decoder operative to decode quantized transformed signal coefficients received across the backhaul communication interface from the network processing unit, based on the number of quantization bits determined by the receive bit allocation unit;

at least one inverse transformation unit operative to perform an inverse linear transformation of the transformed signal coefficients across one or more of time and antenna spatial domains to generate a plurality of time-domain, complex-valued signal samples; and
at least one transmit circuit operative to process the plurality of time-domain, complex-valued signal samples to generate a wireless communication signal;
wherein at least one antenna is further operative to transmit the wireless communication signal.

36. A network processing unit, comprising:
a backhaul communication interface operative to receive quantized transformed signal coefficients and quantization information from a plurality of base stations;
a receive bit allocation unit operative to determine a number of quantization bits for decoding quantized transformed signal coefficients received from a base station, based on the received quantization information;
a decoder operative to decode the received quantized transformed signal coefficients based on the number of quantization bits determined by the receive bit allocation unit;
at least one inverse transformation unit operative to perform an inverse linear transformation of the transformed signal coefficients across one or more of time and antenna spatial domains to generate a plurality of time-domain, complex-valued signal samples; and
a processing circuit operative to process the plurality of time-domain, complex-valued signal samples.

37. The network processing unit of claim 36 wherein the network processing unit is a Central Processor of a Coordinated MultiPoint (CoMP) system, and wherein the processing circuit is a CoMP processing circuit operative to process the plurality of time-domain, complex-valued signal samples along with signal samples received from other base stations.

38. The network processing unit of claim 36 wherein the processing circuit is further operative to generate a plurality of time-domain, complex-valued signal samples representing a precoded wireless communication signal to be transmitted by an antenna at the base station, the network processing unit further comprising:
at least one transformation unit operative to perform a linear transformation of the plurality of time-domain, complex-valued signal samples across one or more of time and antenna spatial domains to generate transformed signal coefficients;
a transmit bit allocation unit operative to determine a number of quantization bits for quantization of the transformed signal coefficients based on the variance of the coefficients; and
a quantizer operative to quantize the transformed signal coefficients using the number of quantization bits determined by the transmit bit allocation unit; and
wherein the backhaul communication interface is further operative to transmit the quantized transformed signal coefficients and quantization information across the backhaul to the base station.

* * * * *